US006998659B2

(12) United States Patent
Raynor

(10) Patent No.: US 6,998,659 B2
(45) Date of Patent: Feb. 14, 2006

(54) LARGE AREA PHOTODIODE

(75) Inventor: Jeff Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 10/401,276

(22) Filed: Mar. 27, 2003

(65) Prior Publication Data

US 2003/0218195 A1 Nov. 27, 2003

(30) Foreign Application Priority Data

Apr. 18, 2002 (EP) ................................ 02252751

(51) Int. Cl.
*H01L 27/146* (2006.01)

(52) U.S. Cl. ...................................... 257/292; 257/461

(58) Field of Classification Search ............... 257/291, 257/292, 461, 465

See application file for complete search history.

(56) References Cited

U.S. PATENT DOCUMENTS 5,861,655 A 1/1999 Kozuka et al. ............ 257/446
5,898,196 A 4/1999 Hook et al. ................ 257/292
6,084,259 A 7/2000 Kwon et al. ................ 257/292
6,150,682 A * 11/2000 Sawada et al. ............ 257/290
6,163,024 A * 12/2000 Kozuka et al. .......... 250/208.1

FOREIGN PATENT DOCUMENTS

EP 0631327 12/1994
JP 61265866 11/1986

* cited by examiner

*Primary Examiner*—Gene M. Munson
(74) *Attorney, Agent, or Firm*—Lisa K. Jorgenson; Allen, Dyer, Doppelt, Milbrath & Gilchrist, P.A.

(57) ABSTRACT

A solid state image sensor has an array of pixels formed on an epitaxial layer on a substrate. Each pixel is relatively large so that it has a high light collecting ability, such as 40–60 $\mu$m, but the pixel photodiode is relatively small so that it has a low capacitance, such as 4–6 $\mu$m. Active elements of the pixel photodiode are formed in wells that are spaced away from the pixel photodiode so that the latter is surrounded by epitaxial material.

20 Claims, 2 Drawing Sheets

LARGE AREA PHOTODIODE

FIELD OF THE INVENTION

The present invention relates to electronics, and more particularly, to a solid-state image sensing structure.

BACKGROUND OF THE INVENTION

It is well known to use CMOS, active pixel image sensors in which incident light generates electrons that are captured by a photodiode in the pixel. When a high speed image sensor is desired, there is less time available for capturing light. One way to address this problem is to increase the illumination level, but this is frequently impracticable or undesirable.

Another approach is to use large pixels, since more photons impinge on a large pixel than a small pixel given the same field of view and field depth. However, in the prior art large pixels have a large photodiode and the capacitance of the photodiode is also increased. These photodiodes are usually operated in a voltage mode, and since V=Q/C, the capacitance rises as the voltage falls.

What is required is a large area pixel, but with a small sensing capacitance. U.S. Pat. No. 5,471,515 describes one approach to this requirement by putting a thin photogate layer over the light collecting part of the pixel. By applying a voltage to the photogate, the electrons are pushed through the transfer gate and into the sense node. However, there are practical disadvantages using this technique with large pixels. One is that a large photogate area is difficult to manufacture with high yields. Another is that pushing the electrons over a large area into the transfer gate (charge transfer efficiency) is also difficult to achieve. These problems may be addressed by modifying the manufacturing process, but this is not desirable since silicon fabrication costs rely on mass produced devices using a standard process.

SUMMARY OF THE INVENTION

In view of the foregoing background, an object of the present invention is to overcome the above described problems associated with an image sensing device.

This and other objects, advantages and features in accordance with the present invention are provided by an image sensor comprising a semiconductor substrate having a first conductivity type, an epitaxial layer on the semiconductor substrate, and an array of pixels on the epitaxial layer. Each pixel comprises a photodiode well having a second conductivity type within the epitaxial layer for forming a photodiode collection node, and an active element well comprising at least one active pixel element within the epitaxial layer. The active element well is spaced away from the photodiode well so that the photodiode well is surrounded by the epitaxial layer.

The first conductivity type may be a P-type conductivity, and the second conductivity type may be an N-type conductivity. Alternatively, the first conductivity type may be an N-type conductivity, and the second conductivity type may be a P-type conductivity.

An area of the photodiode well is small in relation to an area of each pixel. For example, each pixel may have a width within a range of about 40 to 60 μm, and each photodiode well may have a width within a range of about 3 to 10 μm. The epitaxial layer may have a depth within a range of about 4 to 10 μm.

Each pixel may further comprise a narrow zone on the epitaxial layer surrounding the photodiode well. A cover layer on the epitaxial layer surrounds the photodiode well between the active element well and the narrow zone. The cover layer may have a thickness substantially less than a thickness of the photodiode well. The cover layer may extend into the active element well so that it is at a same voltage reference as the active element well.

Another aspect of the present invention is to provide a method for making an image sensor comprising forming an epitaxial layer on a semiconductor substrate having a first conductivity type, and forming an array of pixels on the epitaxial layer. Forming each pixel comprises forming a photodiode collection node having a second conductivity type within the epitaxial layer, and forming an active element well comprising at least one active pixel element within the epitaxial layer. The active element well is spaced away from the photodiode collection node so that the photodiode connection node is surrounded by the epitaxial layer.

BRIEF DESCRIPTION OF THE DRAWINGS

Embodiments of the invention will now be described, by way of example only, with reference to the drawings, in which.

DETAILED DESCRIPTION OF THE PREFERRED EMBODIMENTS

Figure 1:
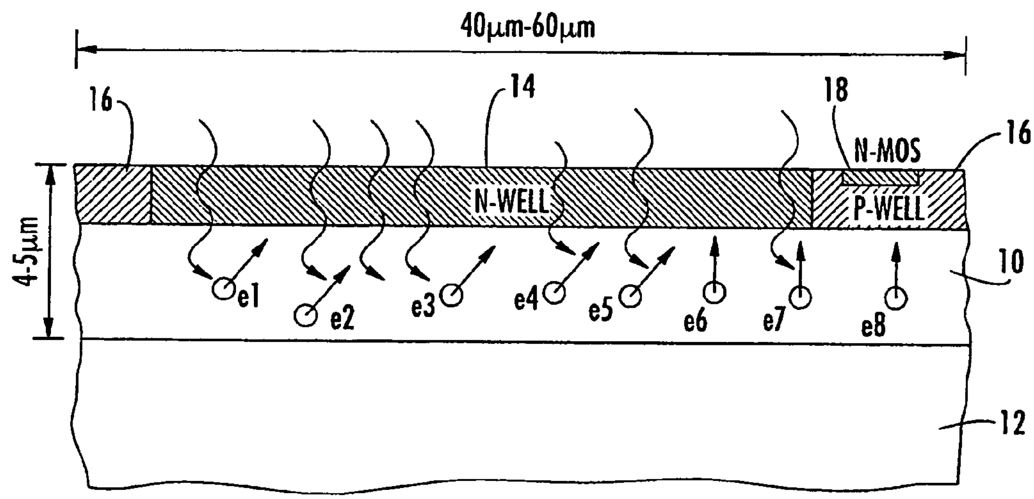
FIG. 1 is a schematic cross-sectional view of one pixel of a prior art image sensor having a large area pixel and large area photodiode.

FIG. 1 shows the pixel layout of one known sensor. The pixel is large in that it has a width of typically 40–60 μm, as opposed to applications such as television which typically have a pixel dimension of 4–6 μm. The pixel is formed in a P-epitaxial layer 10 having a thickness of 4–5 μm. The P-epitaxial layer 10 is on a P substrate 12. The photodiode comprises an N-well 14, and is surrounded by a P-well 16 containing readout circuitry such as the NMOS transistor 18.

In the example of FIG. 1, the photodiode 14 is large in that it occupies most of the surface of the pixel. This leads to a high collection efficiency. Electrons e1–e7 are collected by the photodiode, while electron e8 goes to the P-well 16, which is connected to the supply, and is lost. However, the capacitance of the photodiode 14 is high.

Figure 2:
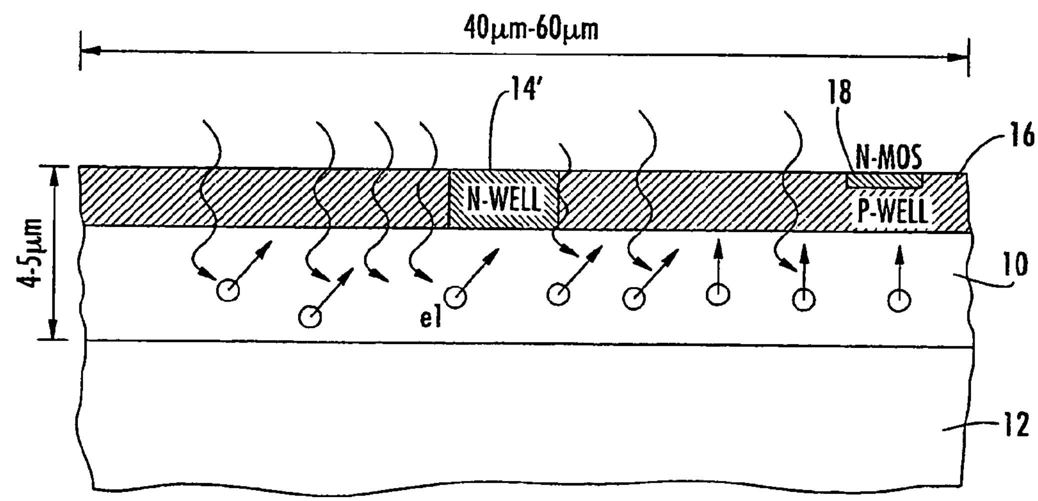
FIG. 2 is a similar view of a prior art sensor having a large area pixel and a small photodiode.

In FIG. 2, a pixel of the same size and general structure has a photodiode N-well 14' that is a small size, and thus of low capacitance. However, the collection efficiency is low. Electron el is collected by the photodiode 14, but all other electrons go to the P-well 16 and are lost.

Figure 3:
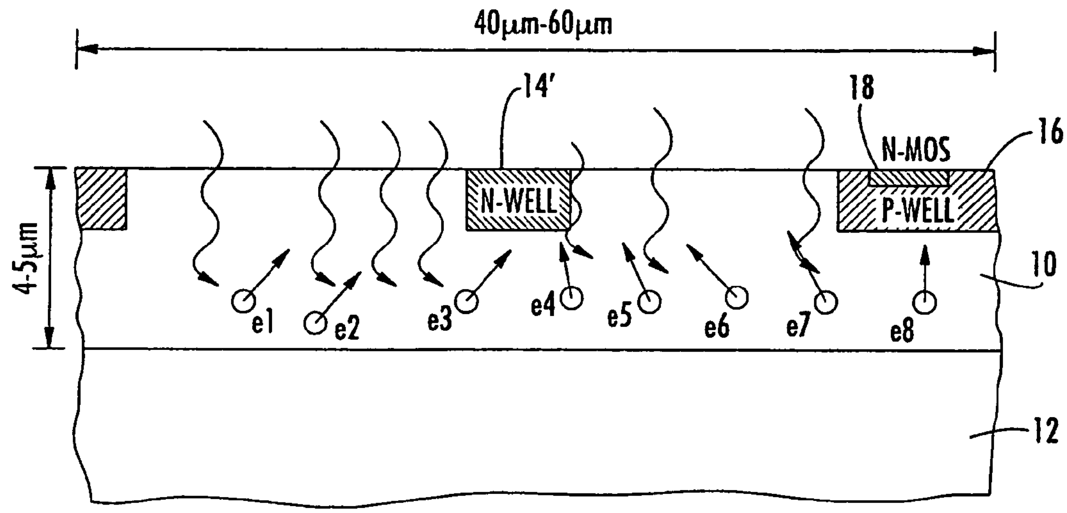
FIG. 3 is a similar view of a first embodiment of the invention.

FIG. 3 shows a basic form of the present invention. The circuit is formed, as before, with a P-epitaxial layer 10 on a P substrate 12, and with a pixel dimension typically 40–60 μm and a depth of 4–5 μm in the epitaxial layer 10.

The photodiode is provided by N-well 14' that is a small size, and pixel circuitry is located within the P-well 16. However, the P-well 16 is spaced away from the N-well 14', such that the N-well 14' is surrounded by epitaxial material.

Due to the absence of P material in the vicinity, the majority of electrons, such as e1–e6 in FIG. 3, will diffuse in the epitaxial layer 10 and ultimately be collected by the N-well 14'. Electron e7 may find its way either to the N-well 14' or to the P-well 16. Electron e8 will most likely find its way to the P-well 16 and be lost.

This effect occurs because the P-epitaxial layer is very lightly doped and is not connected to ground. Photogenerated electrons move at random by thermal diffusion until they are attracted by the positively charged N-well 14' and are detected.

To maximize this effect, the epitaxial layer should be such that incident photons generate electrons within this layer. This process is wavelength dependent. Longer wavelengths penetrate deeper into the semiconductor. An epitaxial layer 4–5 μm thick is sufficient to collect light in the visible part of the spectrum. If infrared light is to be collected, the epitaxial layer should be made thicker, e.g., 10 μm.

For a pixel of the size range shown, a photodiode size of 3–10 μm is practical. The lower figure provides the higher sensitivity, but is constrained by manufacturing tolerances and also its ability to store photons. If too few photons are stored, the photon shot noise is increased and hence the ultimate signal-noise ratio of the sensor is degraded.

Thus, the arrangement of FIG. 3 combines a low photodiode capacitance with a high collection efficiency. The necessary change of structure in comparison with the prior art does not require any change in the manufacturing process, and thus permits low cost fabrication. It may require modification to the mask preparation stage, but this is only a one time cost.

An N-well is preferred for use as the photodiode collection node since it penetrates deeper into the epitaxial layer, and hence is more efficient in collecting electrons. However, in principle, the conductivity types could be inverted, and a P-well may be used in an N-epitaxial layer on an N substrate.

The use of a small photodiode with a large pixel size cannot be extended indefinitely. With larger areas, the electrons will recombine with hole defects in the silicon before being captured, and will be lost. The distance over which the electron will travel before recombination is known as the recombination length, and in modern silicon substrates is typically about 50 μm. Thus, a pixel size of about 60 μm is a practical upper limit with present silicon technology.

Figure 4:
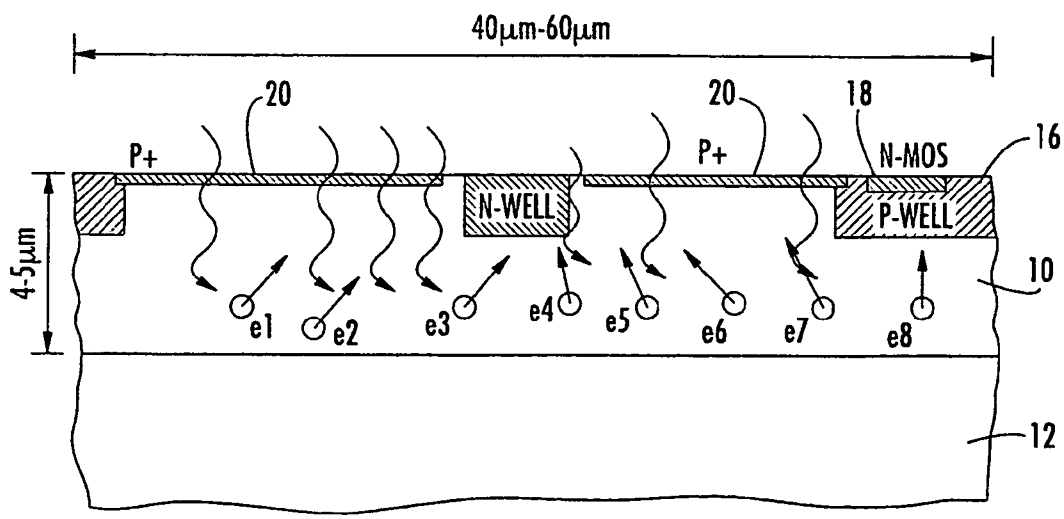
FIG. 4 shows a modified embodiment of the invention.

FIG. 4 shows a modified version of the foregoing embodiment. A thin layer 20 of P+ material is placed over the majority of the pixel. The layer 20 extends into the P-well 16, and hence is electrically connected to it. The P-well 16 is normally at ground potential, and so therefore is the layer 20. The layer 20 is at a lower implant depth and lower potential than the N-well collection node 14, and thus the electrons are more likely to go towards the N-well 14' and be collected. For example, electron e7 in FIG. 4 is more likely than not to go to the N-well 14', whereas electron e7 in FIG. 3 is quite likely to go to the P-well 16 and be lost.

The invention therefore provides an improved structure for image sensors combining large area pixels with low photodiode capacitance in a manner that is relatively straightforward to fabricate.

What is claimed is:

1. An image sensor comprising:

a semiconductor substrate having a first conductivity type;

an epitaxial layer on said semiconductor substrate; and an array of pixels on said epitaxial layer, each pixel comprising a photodiode well having a second conductivity type within said epitaxial layer defining a photodiode collection node, and an active element well within said epitaxial layer comprising at least one active pixel element, said active element well being laterally spaced away from said photodiode well so that all sides of said photodiode well except for an upper surface thereof are completely surrounded by said epitaxial layer, said photodiode well and said active element comprising regions doped at different levels with respect to remaining lateral regions of said epitaxial layer;

each pixel having a width within a range of about 40 to 60 μm, and each photodiode well having a width within a range of about 3 to 10 μm.

2. An image sensor according to claim 1, wherein the first conductivity type is a P-type conductivity, the second conductivity type is an N-type conductivity, and the epitaxial layer is a P-type conductivity.

3. An image sensor according to claim 1, wherein said epitaxial layer has a depth within a range of about 4 to 10 μm.

4. An image sensor according to claim 1, wherein said epitaxial layer has a depth within a range of about 4 to 5 μm for use with visible wavelengths.

5. An image sensor according to claim 1, wherein each pixel further comprises:

a narrow zone on said epitaxial layer surrounding said photodiode well; and a cover layer on said epitaxial layer surrounding said photodiode well between said active element well and said narrow zone, said cover layer having a thickness substantially less than a thickness of said photodiode well.

6. An image sensor according to claim 5, wherein said cover layer extends into said active element well so that it is at a same voltage reference as said active element well.

7. An image sensor according to claim 5, wherein said cover layer has the first conductivity type.

8. An image sensor according to claim 1, further comprising image processing circuitry on said epitaxial layer for processing images from said array of pixels.

9. An image sensor comprising:

a semiconductor substrate having a first conductivity type;

an epitaxial layer on said semiconductor substrate having the first conductivity type; and an array of pixels on said epitaxial layer, each pixel comprising a photodiode well having a second conductivity type within said epitaxial layer defining a photodiode collection node, a narrow zone on said epitaxial layer surrounding the photodiode collection node, an active element well within said epitaxial layer comprising at least one active pixel element, said active element well being laterally spaced away from said photodiode collection node so that all sides of said photodiode well except for an upper surface thereof are completely surrounded by said epitaxial layer, a cover layer on said epitaxial layer having the first conductivity type and surrounding said photodiode collection node between said active element well and said narrow zone, and said photodiode well and said active element well comprising regions doped at different levels with respect to remaining lateral regions of said epitaxial layer.

10. An image sensor according to claim 9, wherein the first conductivity type is a P-type conductivity, and the second conductivity type is an N-type conductivity.

11. An image sensor according to claim 9, wherein the first conductivity type is an N-type conductivity, and the second conductivity type is a P-type conductivity.

12. An image sensor according to claim 9, wherein each photodiode collection node has an area that is small in relation to an area of each pixel.

13. An image sensor according to claim 9, wherein each pixel has a width within a range of about 40 to 60 μm, and each photodiode collection node has a width within a range of about 3 to 10 μm.

14. An image sensor according to claim 9, wherein said epitaxial layer has a depth within a range of about 4 to 10 μm.

15. An image sensor according to claim 9, wherein said cover layer has a thickness substantially less than a thickness of said photodiode collection node.

16. An image sensor according to claim 9, wherein said cover layer extends into said active element well so that it is at a same voltage reference as said active element well.

17. An image sensor according to claim 9, further comprising image processing circuitry on said epitaxial layer for processing images from said array of pixels.

18. An image sensor comprising:

a semiconductor substrate having a first conductivity type;

an epitaxial layer on said semiconductor substrate and having a depth within a range of about 4 to 10 μm; and an array of pixels on said epitaxial layer, each pixel comprising a photodiode well having a second conductivity type within said epitaxial layer defining a photodiode collection node, an active element well within said epitaxial layer comprising at least one active pixel element, said active element well being laterally spaced away from said photodiode well so that all sides of said photodiode well except for an upper surface thereof are completely surrounded by said epitaxial layer, and said photodiode well and said active element comprising regions doped at different levels with respect to remaining lateral regions of said epitaxial layer.

19. An image sensor comprising:

a semiconductor substrate having a first conductivity type;

an epitaxial layer on said semiconductor substrate and having a depth within a range of about 4 to 5 μm for use with visible wavelengths; and an array of pixels on said epitaxial layer, each pixel comprising a photodiode well having a second conductivity type within said epitaxial layer defining a photodiode collection node, and an active element well within said epitaxial layer comprising at least one active pixel element, said active element well being laterally spaced away from said photodiode well so that all sides of said photodiode well except for an upper surface thereof are completely surrounded by said epitaxial layer, said photodiode well and said active element comprising regions doped at different levels with respect to remaining lateral regions of said epitaxial layer.

20. An image sensor comprising:

a semiconductor substrate having a first conductivity type;

an epitaxial layer on said semiconductor substrate; and an array of pixels on said epitaxial layer, each pixel comprising a photodiode well having a second conductivity type within said epitaxial layer defining a photodiode collection node, an active element well within said epitaxial layer comprising at least one active pixel element, said active element well being laterally spaced away from said photodiode well so that all sides of said photodiode well except for an upper surface thereof are completely surrounded by said epitaxial layer, said photodiode well and said active element comprising regions doped at different levels with respect to remaining lateral regions of said epitaxial layer, a narrow zone on said epitaxial layer surrounding said photodiode well, and a cover layer on said epitaxial layer surrounding said photodiode well between said active element well and said narrow zone, said cover layer having a thickness substantially less than a thickness of said photodiode well.

* * * * *